United States Patent [19]
White

[11] Patent Number: 4,524,424
[45] Date of Patent: Jun. 18, 1985

[54] ADAPTIVE SPECTRUM SHAPING FILTER

[75] Inventor: Stanley A. White, Santa Ana, Calif.

[73] Assignee: Rockwell International Corporation, El Segundo, Calif.

[21] Appl. No.: 349,871

[22] Filed: Feb. 18, 1982

[51] Int. Cl.³ .................... H03H 15/02; G11C 19/28; G06F 7/38
[52] U.S. Cl. ................................. 364/724; 333/165; 333/166
[58] Field of Search ............... 364/724, 572, 825, 824; 333/167, 168, 18, 165, 166; 328/167

[56] References Cited

U.S. PATENT DOCUMENTS

| | | | |
|---|---|---|---|
| 3,573,623 | 4/1971 | Bannon et al. | 333/166 |
| 4,249,145 | 2/1981 | Sakaue et al. | 333/166 |
| 4,322,696 | 3/1982 | Sakaue et al. | 333/166 |
| 4,403,245 | 9/1983 | Wischermann | 333/166 |

OTHER PUBLICATIONS

Widrow, B. et al., "Adaptive Noise Cancelling; Principles and Applications", Proc. IEEE, vol. 63, pp. 1692–1716, 12/75.

Paul, J. E., "Adaptive Digital Techniques for Audio Noise Cancellation", Proc. 1978, ISCAS (International Symposium for Circuits and Systems), New York, May 1978.

Primary Examiner—Jerry Smith
Assistant Examiner—Michael R. Fleming
Attorney, Agent, or Firm—H. Fredrick Hamann; Randall G. Wick; David J. Arthur

[57] ABSTRACT

A transversal adaptive filter with a tap weight computer having a respective first and second input responsively coupled to a respective output and input of the filter, and including spectrum shaping means. The spectrum shaping means comprises matched or like preselected bandpass means interposed at the inputs of the tap weight computer.

8 Claims, 10 Drawing Figures

ADAPTIVE SPECTRUM SHAPING FILTER

BACKGROUND OF THE INVENTION

The invention relates to the art of spectrum-shaping or filtering of noisy signals.

The utilization of speech signals, data translation links, communication nets and the like is of times hampered or limited due to the unavoidable presence or injection otherwise of noise and interfering signals. In the receiver process or video detection of noisy RF signals, the video process and associated video circuit delays tend to integrate the presence of such noise. A usual method of obtaining spectral shaping or "filtering" has been the performance of spectrum-whitening by means of the classical predictive-deconvolution filters, as described by B. Widrow et al in the article "Adaptive Noise Cancelling; Principles and Applications", Proc. IEEE, Vol. 63, pages 1692–1716, Dec. 1975. If a spectrum shape other than flat is desired, then the deconvolution filter is usually followed by a second filter whose frequency response matches the shape of the desired spectrum, as described by J. E. Paul in the paper "Adaptive Digital Techniques for Audio Noise Cancellation", Proc. 1978 ISCAS (International Symposium for Circuits and Systems), New York, May 1978 (sponsored by IEEE). Many signal-processing problems, such as the restoration of natural-sounding spectrum to computer-enhanced speech, are amenable to such solution of sequentially spectrum-whitening and then spectral-shaping. However, in noisy signal-processing applications, involving detection of, say, a specific spectral line contained amid a very rich spectrum the above-described method may be inadequate, for the reason that the spectrum whitening procedure discriminates against the sought-after signal as much as any other component of the spectral content. In other words, in flattening and attenuating the spectrum, the spectral line of interest is similarly attenuated.

BRIEF DESCRIPTION OF THE INVENTION

By means of the concept of my invention, the above-noted limitations of the prior art predictive-deconvolution-filter method is avoided, and an improved method of pre-selective spectral shaping is obtained.

In a preferred embodiment of the inventive concept, there is provided a predictive-deconvolution filter having a tap weight computer, a respective first and second input of the tap weight computer responsively coupled to an input and output, respectively, of said filter. Interposed at the inputs of the tap weight computer are matched or paired preselected bandpass means.

In normal operation of the above described arrangement, spectral whitening and suppression occurs for that portion of the spectrum within the bandpass of the matched filter inputs of the tap weight computer, as to thus provide relative enhancement of that spectral portion lying within the bandpass of the system but outside the bandpass of the matched filter inputs to the tap weight computer.

Accordingly, an object of the invention is to provide preselective predictive deconvolution.

Another object of the invention is to provide improved means for detecting a signal carrier amid interference and unwanted carriers.

These and other objects of the invention become more readily apparent from the following description, when taken together with the accompanying drawings, in which:

BRIEF DESCRIPTION OF THE DRAWINGS

In the figures, like reference characters refer to like parts.

DESCRIPTION OF THE PREFERRED EMBODIMENT

Figure 1:
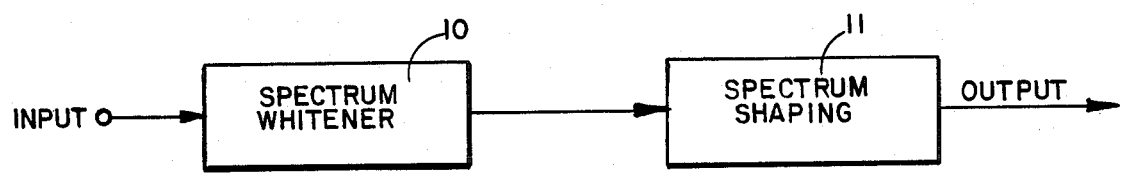
FIG. 1 is a block diagram of a prior art arrangement of spectral whitening and spectral-shaping.
Figure 2A:
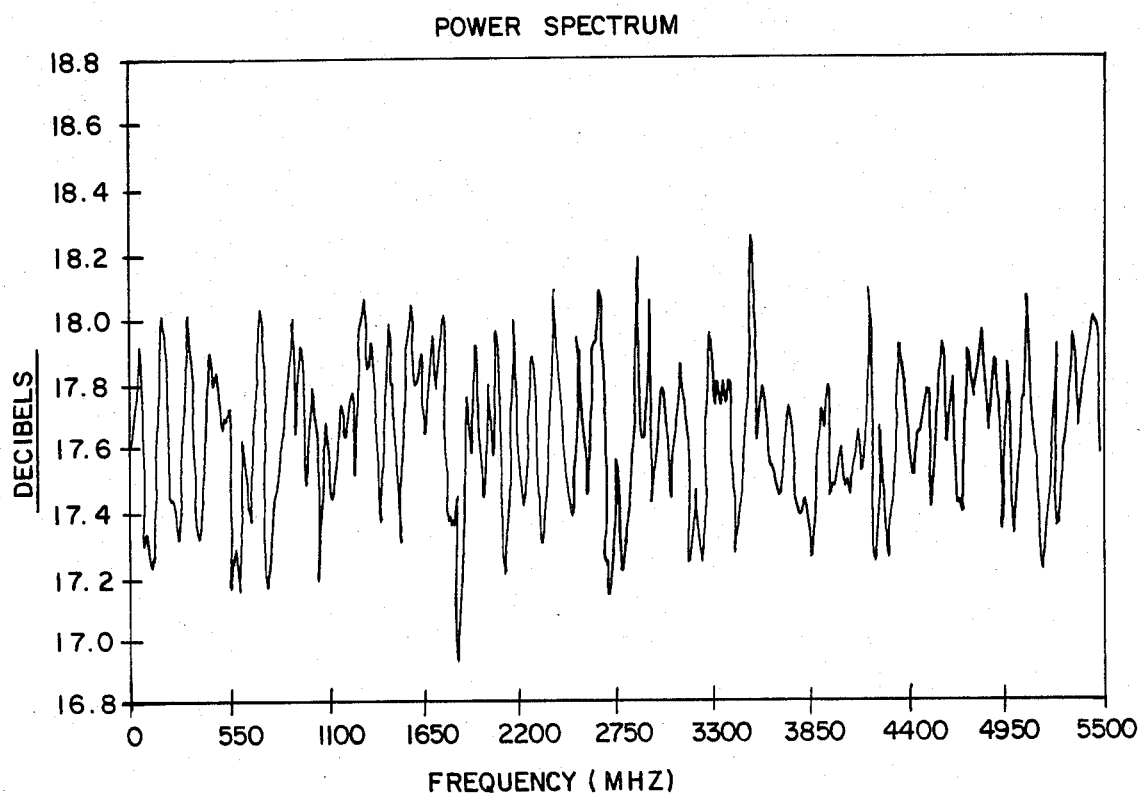
FIG. 2A is a representative spectral diagram of a noisy spectral input of about 18 db level.
Figure 2B:
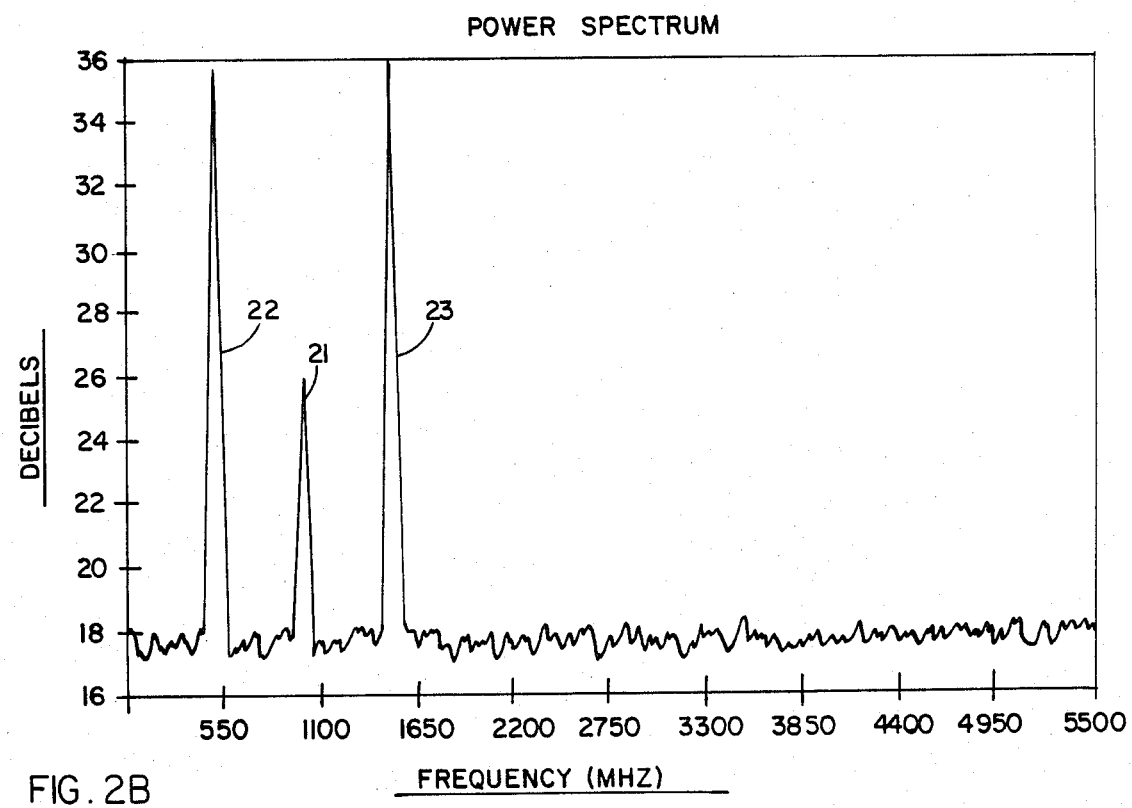
FIG. 2B is a spectral diagram of an exemplary input of three carriers amid the 18 db level noise spectrum.
Figure 3A:
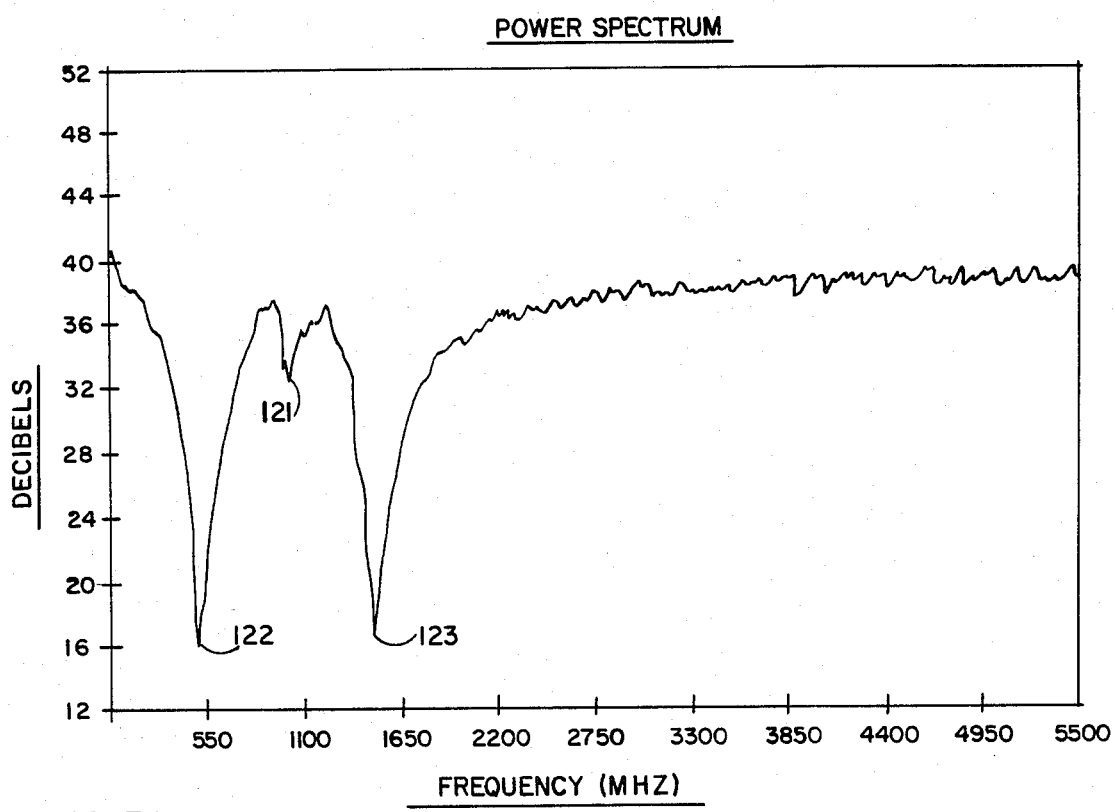
FIG. 3A is a representative response of the spectral whitener of FIG. 1 to the input posed by FIG. 2B, showing the suppression of the carrier of interest.

Referring now to FIG. 1, there is illustrated a block diagram of a prior art arrangement for spectral shaping of a rich spectral content or high spectral density signal input. Such prior art arrangement includes a classic prediction convolution filter 10 (as a spectral whitener) in tandem with and followed by a spectral shaping filter 11. Such an arrangement might be used for whitening (i.e., flattening or levelling and suppressing) and then shaping the approximately 18 db input noise spectrum of FIG. 2A. Such exemplar spectrum is shown as comprising the frequency region of above 550 megahertz and below 5500 megahertz. FIG. 2B depicts the 18 db noisy input of FIG. 2A and also includes a first signal of interest 21 at about 1000 MHZ amid two higher-energy carriers not of interest 22 and 23 at about 500 MHZ and 1500 MHZ, respectively. The frequency spacing between these signals may be about 4½ percent of the system sampling frequency. The effects of whitener 10 in FIG. 1 on the spectral input depicted in FIG. 2B is illustrated in FIG. 3A as tending to have flattened the non-signal bearing noisy part of the spectrum (e.g., the region, say, above 2200 MHZ), the suppressive effect of element 10 being more pronounced on the higher energy spectral elements (of FIG. 2B) and being most pronounced at points 121, 122 and 123 in the output depicted in FIG. 3A, being less pronounced at point 121 (in FIG. 3A) for the lesser element 21 (of FIG. 2B). In other words, the noise spectrum, while "whitened", tends not to be suppressed or notched in the manner of the high energy signal carriers. The phenomenon of such notching of the spectrum in the region of the carriers has been observed in the art by M. J. Shensa in his paper "Non-Weiner Solutions of the Adaptive Noise Canceller with a Noisy Reference", IEEE Trans., Vol. ASSP-28, No. 4, Aug. 1980, pages 468–473.

Figure 3B:
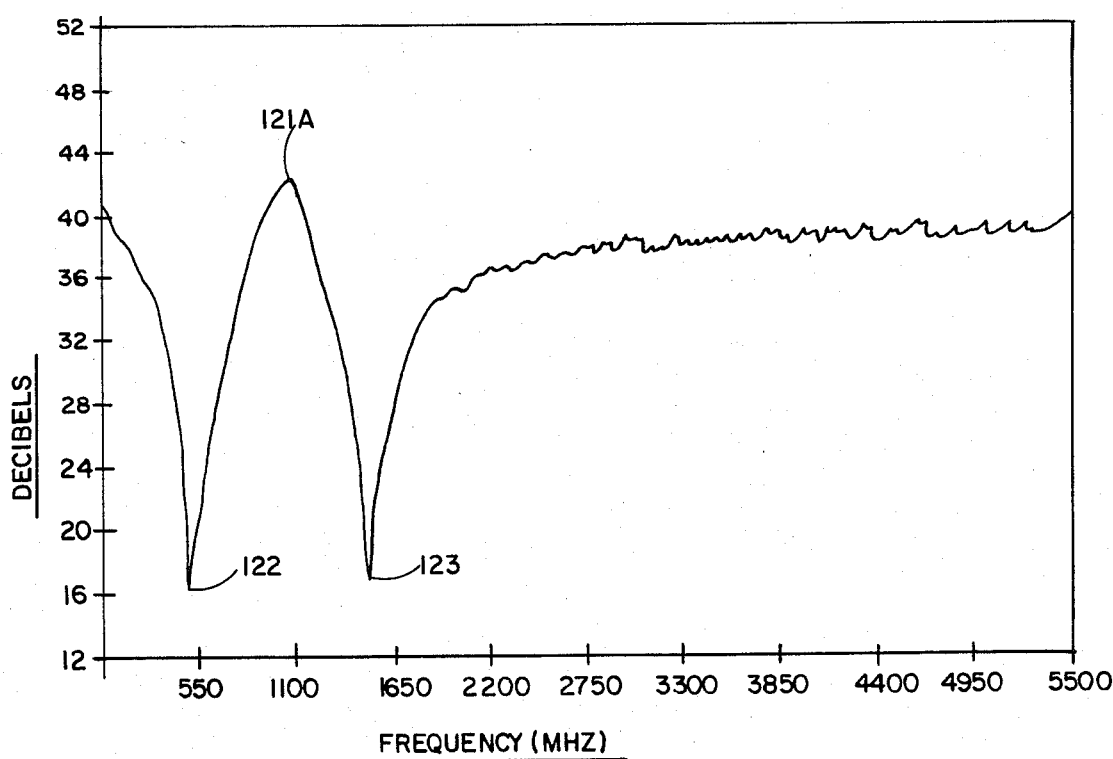
FIG. 3B is an exemplary response of the device of FIG. 1, including the shaping filter, to the applied input of FIG. 2B, showing the limited enhancement achieved for the suppressed carrier of interest in FIG. 3A.

By applying such response of element 10 (as illustrated in FIG. 3A) as an input to the spectral shaper of FIG. 1, only a limited degree of enhancement of the suppressed carrier of interest (point 121 in FIG. 3A) is obtained, as illustrated by the spectral diagram of FIG. 3B. Such overall response would be obtained with, say a second-order shaping filter having a nominally damped resonant mode at the frequency corresponding to the carrier frequency of interest. It is to be observed from a comparison of FIG. 3B with FIG. 3A, that the spectral peaking effect of the shaping filter 11 yet does not cause the carrier signal of interest to significantly stand out from amid the noise.

Figure 4:
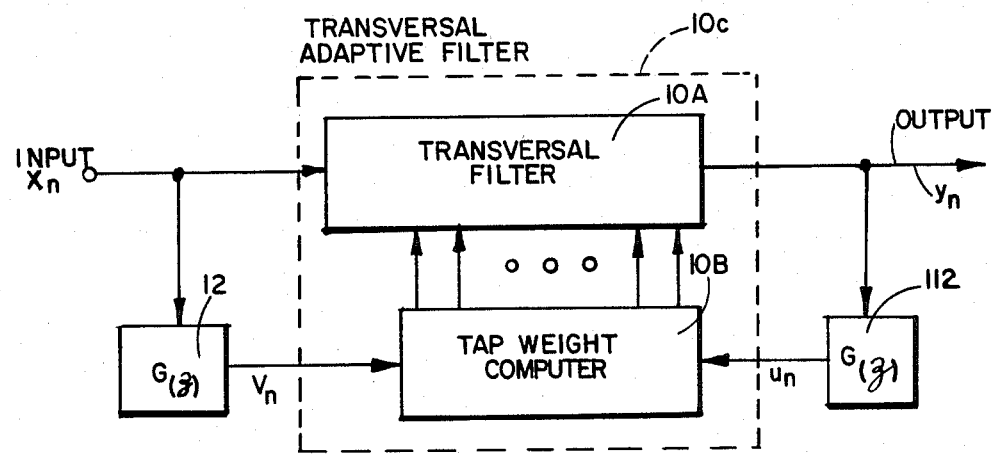
FIG. 4 is a block diagram of a system embodying the inventive concept.

In other words, the performance of the prior-art arrangement in FIG. 1 is only marginal, when compared to that to be achieved by means of the inventive concept depicted in FIG. 4.

Figure 5:
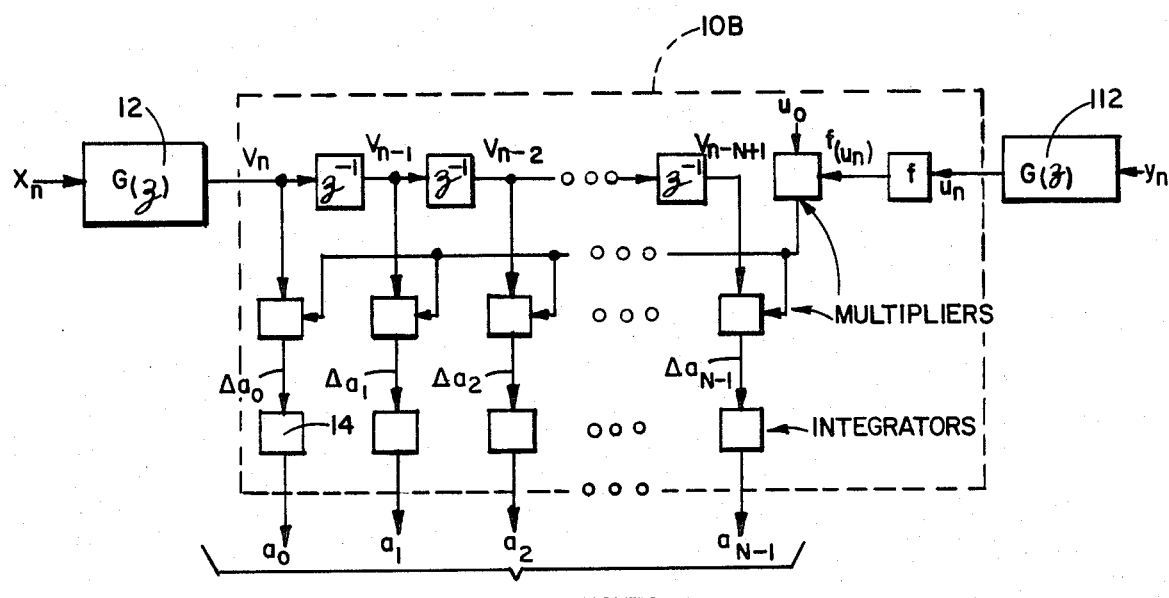
FIG. 5 is a block diagram illustrating in further detail the cooperation between the tap weight computer and matched input filters of FIG. 3.

Referring now to FIG. 4, there is illustrated in block diagram form a system embodying the concept of the invention. There is provided a transversal adaptive filter 10C consisting of transversal filter 10A in cooperation with a tap weight computer 10B and corresponding to the component elements of the prior-art prediction-convolution filter 10 in FIG. 1. A respective first and second input of tap weight computer 10B is responsively coupled to a respective input and output of element 10A. There is further provided, in accordance with the concept of the invention, preselectively band-pass limited means 12 and 112, respectively, interposed at a respective one of the two inputs to tap weight computer 10B. The cooperation of filters 12 and 112 with tap weight computer 10B is shown in further detail in FIG. 5, illustrating the usual tap weight computer arrangement of successive delays $z^{-1}$ of the first input $V_n$; the processing of the second input $u_n$ by a criterion function generator, $f(u_n)$ and scale factor $\mu_o$; multiplying each of the successively delayed first inputs by the processed second input; and then integrating each of the products with respect to time (via a respective one of integrators 14); thereby generating the tap weights $a_o, \ldots a_{N-1}$.

In the arrangement of FIG. 4, the spectrum shaping function is achieved by means of the cooperation of filters 12 and 112. Each of such filters may be comprised of a simple second order notch filter whose 3 db bandwidth is 1% of the sampling frequency. The construction and arrangement of notch filters is well-understood to those skilled in the art, as indicated by U.S. Pat. No. 3,241,077 for "SELF-ADAPTIVE CONTROL SYSTEM ELIMINATING VARIABLE UNWANTED COMPONENTS", issued Mar. 15, 1966 to R. K. Smyth, et al. The application of such art to sampled data systems is also well understood in the art, as indicated by the reference "Design of Digital Notch Networks for Use in Servomechanisms", IEEE Trans. Ind. Electronic Control Instrum., V.IECT-20, N.3, 8173, pages 138–144, for example. Accordingly, elements 12 and 112 are shown in FIGS. 4 and 5 in block form only for convenience in exposition.

The selection of the performance criterion $F(u_n)$ and its derivative $dF(u_n)/du_n = f(u_n)$ for convergence to a unique and true minimum, in the design of the transversal adaptive filter, is well understood in the art. See, for example, S. A. White, "Theory and Design of Linear Estimators for Adaptive Automatic-Control Systems, PhD Thesis, Purdue University, Lafayette, Ind., June 1965. The rate of adjustment of each parameter by a steepest-descent parameter adjustment rule, to assure such convergence, is more fully described in P. Eykhoff, "Some Fundamental Aspects of Process-Parameter Estimation", Trans. IEEE, Vol. AC-8, No. 4, Oct. 1963, pages 347–357; and in C. B. Tompkins, "Methods of Steep Descent", Chapt. 18 of Modern Mathematics for the Engineer, Ed. E. F. Beckenbach, McGraw Hill, New York 1956.

If a least-absolute value (LAV) performance criterion is used, then $F(u_n) = min \ |u_n|$ and $f(u_n) = sgn \ u_n$. In such case the multipliers 13 of FIG. 5 can then be replaced by inverters and multiplexer switches, because $$\Delta a_j = (V_{jn})(Sgn \ u_n).$$

where:

$\Delta a_j$ = adjustments to the tap weighting, $a_j$
$V_{jn}$ = tap weight computer input from element 12.
$u_n$ = tap weight computer input from element 112.

That such criterion provides an unbiased estimate of the minimum mean absolute error, is shown by W. B. Davenport, Jr. and W. L. Root, "An Introduction to the Theory of Random Signals and Noise", Capts. 5, 14, McGraw Hill, New York, 1958 and does not constitute an aspect of the invention.

In a preferred embodiment, the center of the notch bandwidth of each of filters 12 and 112 (in FIGS. 4 and 5) is preselected to correspond to the carrier spectral line 21 of interest (in FIG. 2B).

Figure 6A:
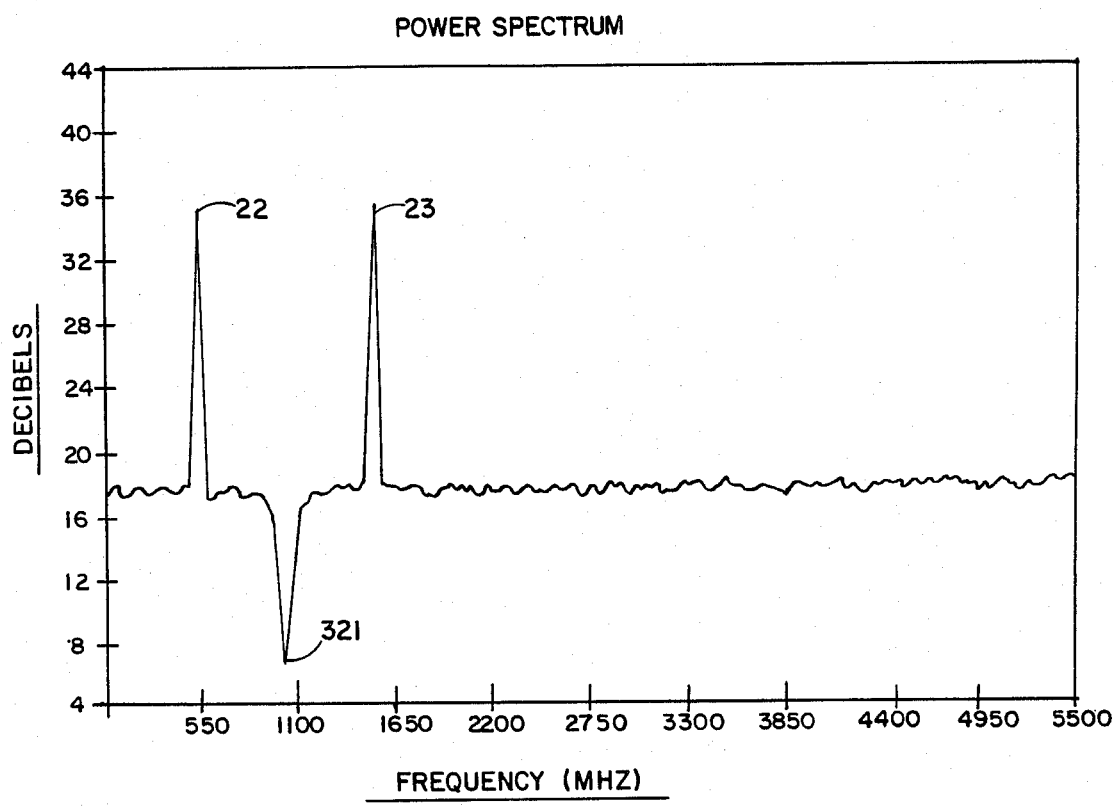
FIGS. 6A and 6B are representative spectral outputs of the augmenting input and feedback filters to the tap weight computer for the system of FIG. 4 in response to the applied system input depicted in FIG. 2B.
Figure 6B:
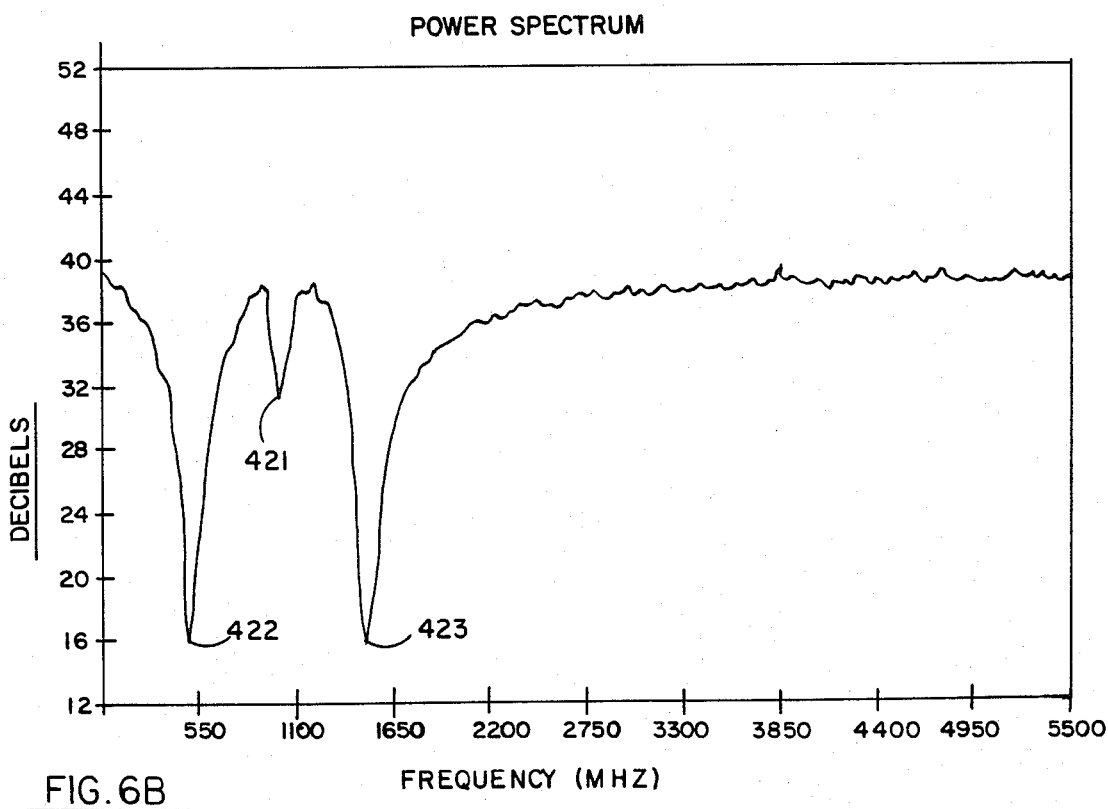
Figure 6C:
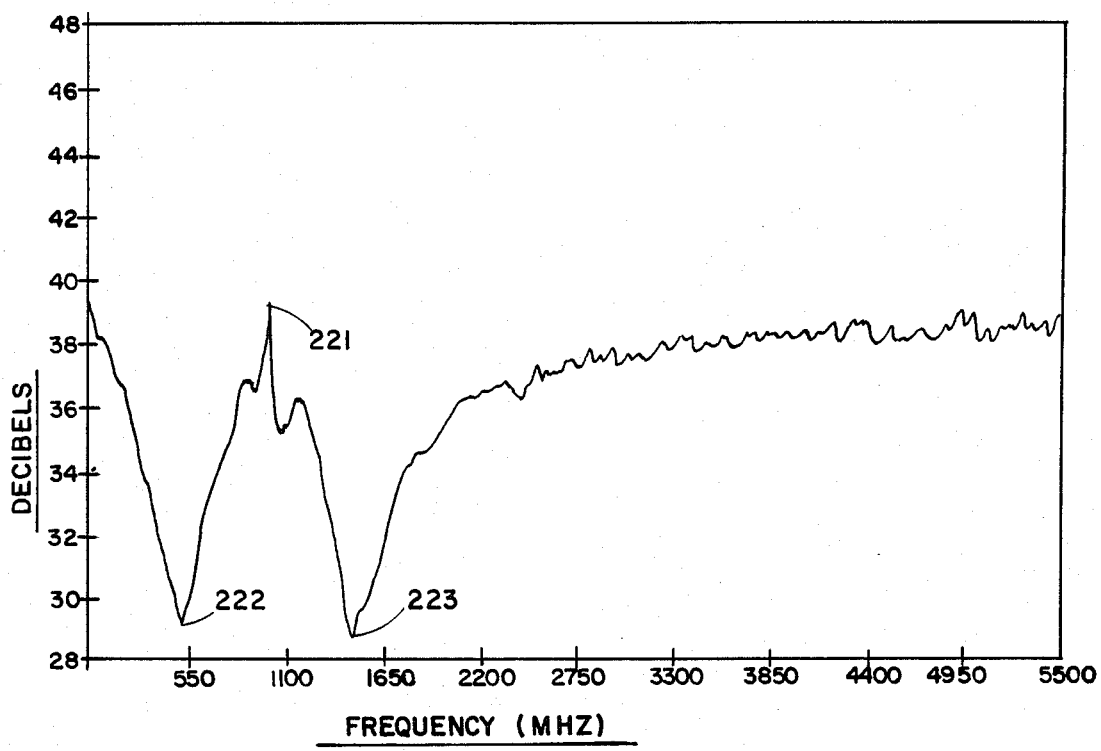
FIG. 6C is a representative spectral output of the inventive system of FIG. 4 in response to the applied system input depicted in FIG. 2B.

Thus, in normal operation of the arrangement of FIG. 4, each of filters 12 and 112 exhibits a frequency response which is, generally, the inverse of the shaped output spectrum desired from the transversal adaptive filter 10A. The cooperation of elements 10A and 10B in FIG. 4 tend to flatten the output spectrum from element 112 in the usual way, but for suppression of the three high-energy spectral lines 421, 422 and 423 in the applied input spectrum as shown in FIG. 6B. Therefore, the input to element 112 (corresponding to the output of element 10A) will tend to be the inverse of the frequency response of element 112, and hence will tend to demonstrate the desired spectral output or spectral shape. FIG. 6A depicts the response of notch filter 12 to the applied input of FIG. 2B to the device of FIG. 4, while FIG. 6B depicts the associated output response of the second notch filter 112 (in cooperation with the transversal adaptive filter 10A) of FIG. 4. It is to be noted from a comparison of FIGS. 2B and 6A that the effect of first notch filter 12 is to notch or suppress the carrier of interest 21, as shown by point 321 in FIG. 6A. It is to be similarly noted from a comparison of FIG. 6B (i.e., the output to element 112) and 6C (i.e., the input to element 112, corresponding to the output of element 10A) that in the spectral region of interest (i.e., points 221 and 421 in FIGS. 6C and 6B, respectively) the output of element 10A of FIGS. 4 and 5 displays an enhanced response over that of the noise spectrum and which is the inverse of the frequency response characteristic of the notch filter. As noted above, such response point 221 in FIG. 6C for the device of FIG. 4 is clearly enhanced relative to point 121A in FIG. 3B associated with the device of FIG. 1.

Although the concept of the invention has been described in terms of employing notch filters for spectral-shaping elements 12 and 112 in FIGS. 4 and 5, the concept of my invention is not so limited, and other frequency shaping forms may be employed.

Although the invention has been described and illustrated in detail, it is to be clearly understood that the same is by way of illustration and example only and is not to be taken by way of limitation, the spirit and scope of this invention being limited only by the terms of the appended claims.

I claim:

1. An adaptive spectrum shaping filter for selectively passing input signals of a preselected frequency to produce filtered output signals, said spectrum shaping filter comprising:
    a transversal filter having an input for receiving said input signals, an output for producing said output signals, and a plurality of adjustable tap weights;
    a tap weight computer having first and second inputs and having means for adjusting said tap weights of said transversal filter;
    a first spectrum-shaping filter coupled between said computer first input and said transversal filter input for filtering said input signals and providing filtered input signals to said tap weight computer; and
    a second spectrum-shaping filter coupled between said computer second input and said transversal filter output for filtering said output signals and providing filtered output signals to said tap weight computer.

2. The device of claim 1 in which said spectrum-shaping filters are of like frequency response.

3. The device of claim 2 in which said spectrum-shaping filters are like notch filters having a common bandwidth.

4. The device of claim 1 in which said spectrum-shaping filters are notch filters.

5. A transversal adaptive filter for processing a signal including a plurality of spectral lines including a predetermined spectral line of interest comprising:
    a transversal filter for performing spectrum-whitening of the signal, said transversal filter having a plurality of adjustable taps for determining a spectral shaping operation on said signal;
    a bandpass filter having an input for receiving said signal, and an output, the center of the bandwidth of the bandpass region corresponding to the frequency of said predetermined spectral line; and
    a tap weight computer having an input connected to said output of said bandpass filter, and an output connected to said adjustable taps, said tap weight computer functioning to calculate a set of tap weights for said transversal filter so as to perform spectral whitening of said signal within the spectral bandpass region of the input of said tap weight computer and enhancement of the spectral portion of said signal outside said bandpass region.

6. An adaptive sampled data filter comprising a transversal filter having a plurality of adjustable tap weights and a correlator-type tap weight computer interfaced with said transversal filter for adjusting the tap weights thereof, said transversal filter having input and output terminal means and said tap weight computer including means by which to set the tap weights of said transversal filter for effecting spectrum-whitening of the spectrum of an input signal applied to said sampled data filter at said transversal filter input terminal means, such that a spectrum-whitened output signal is supplied by said sampled data filter at said transversal filter output terminal means, and
    a first spectral shaping filter interconnected with said sampled data filter between said transversal filter input terminal means and a first input terminal of said tap weight computer, said first spectral shaping filter receiving the input signal applied to said sampled data filter, and
    a second spectral shaping filter interconnected with said sampled data filter between said transversal filter output terminal means and a second input terminal of said tap weight computer, said second spectral shaping filter receiving the spectrum-whitened output signal supplied by said sampled data filter,
    said first and second spectral shaping filters providing filtered input signals to said tap weight computer for preselective spectrum-shaping of the spectrum-whitened output signal supplied by said sampled data filter.

7. The device of claim 6, in which said first and second spectral-shaping filters comprise matched first and second band pass/band rejection filters.

8. The device of claim 7 in which said matched first and second bandpass/band rejection filters comprise like notch filters.

* * * * *